(12) United States Patent
Koester

(10) Patent No.: US 8,683,255 B2
(45) Date of Patent: Mar. 25, 2014

(54) CIRCUIT AND METHOD FOR CONTROLLABLY DELAYING AN INPUT SIGNAL, AND MICROSCOPE, AND METHOD FOR CONTROLLING A MICROSCOPE

(71) Applicant: Leica Microsystems CMS GmbH, Wetzlar (DE)

(72) Inventor: Thorsten Koester, Edingen-Neckarhausen (DE)

(73) Assignee: Leica Microsystems CMS GmbH, Wetzlar (DE)

( * ) Notice: Subject to any disclaimer, the term of this patent is extended or adjusted under 35 U.S.C. 154(b) by 0 days.

(21) Appl. No.: 13/894,455

(22) Filed: May 15, 2013

(65) Prior Publication Data

US 2013/0311816 A1    Nov. 21, 2013

(30) Foreign Application Priority Data

May 16, 2012  (DE) .......................... 10 2012 208 306
Sep. 10, 2012  (DE) .......................... 10 2012 215 995

(51) Int. Cl.
*G06F 1/00*  (2006.01)

(52) U.S. Cl.
USPC ............................ 713/500; 327/100; 327/334

(58) Field of Classification Search
USPC ................................... 713/500; 327/100, 334
See application file for complete search history.

(56) References Cited

U.S. PATENT DOCUMENTS 5,376,849 A * 12/1994 Dickol et al. ................. 327/278
2006/0164142 A1 * 7/2006 Stanley ......................... 327/172
2011/0149290 A1 * 6/2011 Schulte et al. ................ 356/445
2011/0273768 A1 * 11/2011 Krishnamachari et al. ... 359/388

FOREIGN PATENT DOCUMENTS

DE         102009055993 A1    6/2011

* cited by examiner

*Primary Examiner* — Vincent Tran
(74) *Attorney, Agent, or Firm* — Leydig, Voit & Mayer, Ltd.

(57) ABSTRACT

A circuit for delaying an input signal includes first and second delay units. The input signal is switched to the first delay unit which is configured to delay the input signal by k cycles of a first clock signal so as to generate a value $x_{t\_k}$ and transfer the input signal to the second delay unit. The second delay unit includes a converter and a second shift register. The converter is connected to the second shift register by n leads. The value $x_{t\_k}$ and a value $x_{t\_k-1}$ are present at the converter, where $x_{t\_k-1}$ is the input signal delayed by k−1 cycles of the first clock signal, The converter is configured such that the value $x_{t\_k-1}$ is present on leads 1 to m and the value $x_{t\_k}$ is present on leads m+1 to n. The second shift register is configured to successively output values present on leads 1 to n.

11 Claims, 3 Drawing Sheets

CIRCUIT AND METHOD FOR CONTROLLABLY DELAYING AN INPUT SIGNAL, AND MICROSCOPE, AND METHOD FOR CONTROLLING A MICROSCOPE

CROSS REFERENCE TO RELATED APPLICATIONS

This application claims priority to German Patent Application Nos. DE 10 2012 208 306.5, filed May 16, 2012, and DE 10 2012 215 995.9, filed Sep. 10, 2012, which are hereby incorporated by reference herein in their entirety.

FIELD

The invention relates to a circuit for controllably delaying an input signal, the circuit comprising a first delay unit and a second delay unit, the input signal being switched to the first delay unit which, in order to generate a value $x_{t\_k}$, delays the input signal by k cycles of a first clock signal and transfers it to the second delay unit.

The invention further relates to a method for controllably delaying an input signal, encompassing the step of: delaying the input signal by k cycles of a first clock by means of a first delay unit in order to obtain a value $x_{t\_k}$.

The invention further relates to a microscope and to a method for controlling a microscope in order to investigate an object.

BACKGROUND

Controllable delay circuits are needed in a wide variety of technical application sectors in order to delay an input signal in defined fashion as a function of a control value. One application example is a confocal microscope, in which pulsed laser light is emitted by means of a laser light source in order to illuminate the specimen to be investigated. The detected light proceeding from the specimen is detected by means of a detection device. The intensity of the laser light beam generated by the laser light source is controlled by a first control signal. A second control signal is provided in order to control the detection device. Because the laser light beam generated by the laser light source produces the detected light beam, for example by reflection of the laser light beam at the specimen to be illuminated, or by bringing about fluorescence effects, the detected light is to be expected at the detection device within a defined delay time after emission of a laser light beam. The second control signal is therefore often a time delay of the first control signal. Generation of the second control signal from the first control signal requires very precise circuits, adjustable with high resolution, for controllably delaying an input signal. The delay times are usually on the order of 1 to 2 nanoseconds.

One such circuit for delaying an input signal in a microscope is disclosed in DE 10 2009 055 993 A1. Here firstly a coarse delay is generated by means of a first delay unit, and then a fine delay is generated by means of a second delay unit. The second delay unit is made up of a pulse shaper that outputs signals to two shift registers. The signals outputted by the two shift registers are combined by means of a double data rate (DDR) flip-flop in order to generate and output the output signal.

The circuit known from the existing art is disadvantageous in that the circuit is of relatively complex construction, and in that the resolution with which the delay times can be adjusted is comparatively low. Although the resolution of the circuit can be increased within certain limits by increasing the clock rate of the shift register of the second delay unit, the complexity of the circuit prevents the clock rate from being increased arbitrarily.

SUMMARY

In an embodiment, the present invention provides a circuit for controllably delaying an input signal including a first delay unit and a second delay unit. The input signal is switched to the first delay unit which is configured to delay the input signal by k cycles of a first clock signal so as to generate a value $x_{t\_k}$ and transfer the input signal to the second delay unit. The second delay unit includes a converter and a second shift register. The converter is connected to the second shift register by n leads. The value $x_{t\_k}$ and a value $x_{t\_k-1}$ are present at the converter, where $x_{t\_k-1}$ is the input signal delayed by k−1 cycles of the first clock signal, The converter is configured such that a value $x_{t\_k-1}$ is present on leads 1 to m and a value $x_{t\_k}$ is present on leads m+1 to n, where $1 \leq m \leq n$. The second shift register is configured to successively output values present on leads 1 to n as an output signal of the circuit.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
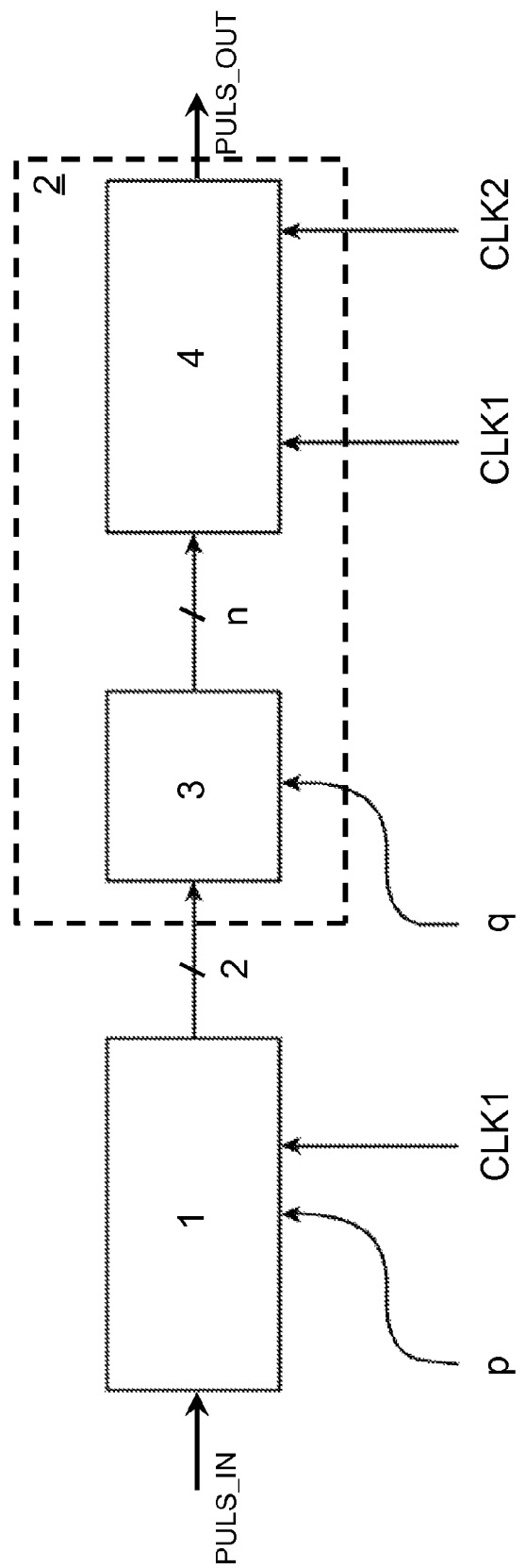
FIG. 1 is a block diagram of an exemplifying embodiment of a circuit according to the present invention, having a first delay unit and a second delay unit, FIG. 2 schematically depicts the manner of operation of the converter that is used in the exemplifying embodiment according to FIG. 1.

An aspect of the present invention is based on configuring and refining a circuit and a method of the kind recited earlier in such a way that flexible adjustability of the delay of the input signal with high resolution is achievable, while at the same time the circuit and the method are of the simplest possible configuration. A further intention is to describe a microscope and a method for controlling a microscope in which flexible adjustability of the delay of the input signal with high resolution is achievable, while at the same time the configuration is as simple as possible.

In an embodiment, the present invention provides a circuit for controllably delaying an input signal including a first delay unit and a second delay unit, the second delay unit including a converter and a second shift register, the converter being connected to the second shift register by means of n leads, that the value $x_{t\_k}$ and a value $x_{t\_k-1}$ are present at the converter, $x_{t\_k-1}$ being the input signal delayed by k−1 cycles of the first clock signal, that the converter is configured in such a way that a value $x_{t\_k-1}$ is present on leads 1 to m and a value $x_{t\_k}$ is present on leads m+1 to n, where 1≤m≤n, and that the second shift register successively outputs the values present on leads 1 to n as an output signal of the circuit.

In an embodiment, the present invention provides a method including:

transferring the value $x_{t\_k}$ to a converter, transferring a value $x_{t\_k-1}$ to the converter, $x_{t\_k-1}$ being the input signal delayed by k−1 cycles of the first clock signal, outputting of the value $x_{t\_k-1}$ on leads 1 to m by the converter, where 1≤m≤n, outputting of the value $x_{t\_k}$ on leads m+1 to n by the converter, transferring the values present on leads 1 to n to a second shift register, and successively outputting the values present on leads 1 to n as an output signal by means of a second shift register.

In an embodiment, the present invention provides a microscope for investigating a specimen is described, the microscope encompassing a laser light source for illuminating the specimen and a detection device for detecting the detected light proceeding from the specimen, a first control signal serving to control an illuminating laser beam generated by the laser light source, and a second control signal serving to control the detection device, and the first control signal being switched as an input signal to a circuit, and the second control signal being constituted by the output signal of the circuit.

In an embodiment, the invention provides a method for controlling a microscope having a laser light source and a detection device is described, the laser light source being controlled by a first control signal, the detection device being controlled by a second control signal, the second control signal being generated by controllably delaying the first control signal using a particular method, the first control signal being switched as an input signal to the first delay unit, and the second control signal being constituted by the output signal of the second shift register.

What has been recognized according to the present invention is firstly that one key to improving the resolution of the circuit's delay lies in an appreciable simplification of the second delay unit. It has further been recognized according to the present invention that the second delay can be appreciably simplified by the fact that the second delay unit is constructed from a converter and a second shift register that interact in a particular manner. The converter functions here, as it were, as a serial-parallel converter, and the second shift register is used as a parallel-serial converter.

The converter and the second shift register are connected to one another by means of n leads. The term "lead" is to be understood broadly. Any technical means with which a logic value or a signal can be transferred from the converter to the second shift register can be regarded as a lead.

The values $x_{t\_k}$ and $x_{t\_k-1}$ are present at the converter, $x_{t\_k}$ being the input signal delayed by k cycles of a first clock signal, and $x_{t\_k-1}$ being the input signal delayed by k−1 cycles of the first clock signal. The converter is configured in such a way that the value $x_{t\_k-1}$ is present on leads 1 to m, and the value $x_{t\_k}$ is present on leads m+1 to n, where 1≤m≤n. The instance m=n covers the fact that the value $x_{t\_k-1}$ is present on all leads 1 to n, and the value $x_{t\_k}$ is not outputted on any of the leads. The second delay unit can thereby, with corresponding adaptation of the first delay unit and the second delay unit to one another, generate a delay equal to one cycle of the first clock signal. This is of interest in cases in which the shift by the first delay unit would correspond exactly to the desired delay of the overall circuit. This configuration allows the circuit according to the present invention and the method according to the present invention also to cover such cases.

Because m is a relatively freely definable boundary, it is self-evident that the converter can also be configured in such a way that the value $x_{t\_k-1}$ is present on leads 1 to m−1, and the value $x_{t\_k}$ is present on leads m to n. Here again, 1≤m≤n. The case of a zero shift by the second delay unit is constituted in this embodiment by the instance m=1. Be it noted that this embodiment as well is to be covered by the appended claims.

Thanks to the second shift register, the values present on leads 1 to n are outputted successively as an output signal of the circuit, and thus converted again into a serial value stream. As a result of this interplay according to the present invention between the converter and second shift register, the second delay unit can shift the "boundary" between the value $x_{t\_k-1}$ and $x_{t\_k}$ with relatively high resolution. It is thereby possible to influence the input signal in such a way that what is generated at the output of the circuit is an output signal that lies, with a time resolution of 1:n, between the input signal delayed by k cycles of the first clock signal and the input signal delayed by k−1 cycles of the first clock signal. This allows an appreciably higher resolution to be implemented than in the case of the circuit of the existing art.

The result is that with the circuit according to the present invention and the method according to the present invention, a "coarse" delay can be set using the first delay unit, i.e. the input signal can be delayed with a relative coarse interval and over a relatively wide range. The second delay unit is used for a "fine" delay; i.e. with a time resolution of 1:n, a delay between two delays achievable using the first delay unit can be obtained. With the circuit according to the present invention and the method according to the present invention, it is thereby possible to achieve flexible adjustability and high time resolution of the controllable delay. The resolution now depends only on the width of the shift register and on the speed at which the shift operations of the shift register can be carried out. The resolution of the circuit as a whole can thereby be considerably increased.

The second shift register is preferably clock-timed using a second clock signal. To synchronize the shift operations of the second shift register with the delay of the first delay unit, the second shift register can be timed using a second clock signal which is generated in such a way that the ratio of the period length $T_{CLK1}$ of the first clock signal to the period length $T_{CLK2}$ of the second clock signal is equal to the width of the second shift register. Stated in terms of frequency, the second clock signal would be generated in such a way that the ratio of the frequency $f_{CLK1}$ of the first clock signal to the frequency $f_{CLK2}$ of the second clock signal is equal to the ratio between 1 and the width of the second shift register. This can be stated as:

$$T_{CLK1}:T_{CLK2}=n:1 \text{ or}$$

$$f_{CLK1}:f_{CLK2}=1:n$$

the respective frequency $f_{CLK1}$ and $f_{CLK1}$ being the reciprocal of the respective period length. The second clock signal can be generated on the one hand by multiplying the frequency of the first clock signal. On the other hand, the first clock signal can be generated by clock division of the second clock signal. As a further alternative, the first clock signal and the second clock signal can be generated on the basis of a third clock signal. Methods and circuits for generating two such clock signals are sufficiently known from the existing art.

The first delay unit is preferably constituted by a first shift register whose effective length k can be controlled by a first control value. Like an ordinary shift register, this variable shift register shifts the input signal present at the input, at each active (usually rising) clock edge, one location further within the shift register memory. In the case of a variable shift register, however, the delayed input signal is not outputted after a fixed number of shift operations. Instead, the effective length of the variable shift register can be controlled in such a way that that bit of the shift register memory which is coupled out of the shift register can be defined by the first control value. In this manner a delay time between a clock cycle and the maximum number of clock cycles, which is defined by the maximum length of the first shift register, can be set as a function of the first control value. A coarse delay of the input signal can thereby be implemented.

In a preferred embodiment of the converter, the latter is constituted by a combinatorial logic unit, i.e. logic gates are used to define the output of $x_{t\_k-1}$ or $x_{t\_k}$ at the respective outputs of the converter. This configuration of the converter allows a very fast circuit with a low internal delay time to be achieved.

The converter is preferably controlled by a second control value by means of which m, and thus the boundary between the output of $x_{t\_k-1}$ and the output of $x_{t\_k}$, can be defined and controlled. It is evident that the above-described functionality of the converter is achievable by skillful tuning of the control values and of the structure of the converter.

When the converter is configured as a combinatorial logic unit, the bits of the second control value can directly control the gates of the combinatorial logic unit. The output of $x_{t\_k-1}$ can be selected by the one logic value of a bit of the second control value, and the output of $x_{t\_k}$ can be selected by the other logic value of the bit. With this first configuration of the second control value, the converter can be kept very simple. The second control value must, however, have a width of n bits.

In a second embodiment of the second control value, the combinatorial logic unit can be preceded by a decoder circuit that decodes an m defined by the second control value into suitable logic values for the gates. The decoder circuit would then output, to all gates that are provided for leads 1 to m, a logic value for the output of $x_{t\_k-1}$. Correspondingly, the gates that are provided for leads m+1 to n would be authorized by the other logic value to output $x_{t\_k}$. The result is that the second control value does not need to have a width of n bits but instead can be much less wide, for example as binary number.

Corresponding considerations apply if the converter is configured in such a way that the value $x_{t\_k-1}$ is outputted onto leads 1 to m−1, and the value $x_{t\_k}$ is outputted onto leads m to n.

The circuit preferably furthermore encompasses a control device that generates the first control value and the second control value and outputs them to the first and to the second delay unit, respectively. The control unit can contain the necessary "knowledge" as to which control values must be selected in order to achieve a specific delay time. This knowledge includes, for example, the period lengths of the first and the second clock signal, or the width n of the second shift register. This allows, for example, a user or a control computer to specify a delay time without having to know how the first and the second control value need to be selected. The control device can calculate the correct control values from the specified delay time, and output them respectively to the first and the second delay unit.

In a preferred embodiment of the circuit according to the present invention, the first delay unit can be configured in such a way that it transfers both $x_{t\_k-1}$ and $x_{t\_k}$ to the second delay unit. This can easily be implemented by the fact that in addition to the input signal delayed by k cycles of the first clock signal, the input signal delayed by k−1 cycles of the first clock signal is also outputted. Because both values are in any case present in the first delay unit, output to the second delay unit is usually easy to implement.

A first delay unit in which the output of two delay units is not possible could, however, also be used. In these cases the first delay unit could transfer only $x_{t\_k-1}$ to the second delay unit, and the second delay value $x_{t\_k}$ could be generated by the second delay unit. The signal transferred to the second delay unit would then be delayed within the second delay unit by a further cycle of the first clock system, and would thereby generate $x_{t\_k}$. Both $x_{t\_k-1}$ and $x_{t\_k}$ would thus once again be available in the second delay unit. Alternatively, the second delay unit could be preceded by a separate delay element for generating $x_{t\_k-1}$.

To avoid the presence of undefined levels at the input of the second shift register, the second shift register can possess a trigger input at which the first clock signal is preferably present. The second shift register could react to a signal at the trigger input in such a way that at a rising or a falling edge of the signal, the logic values present on leads 1 to n are transferred into the memory locations of the second shift register.

With regard to one aspect of the invention, the circuit according to the present invention is used in a microscope. A microscope that can in principle be suitably reconfigured for use of the circuit according to the present invention is disclosed, for example, in the Applicant's DE 10 2009 055 993 A1. The circuit according to the present invention is used in this context to derive the second control signal, by delaying, from the first control signal. The first control signal constitutes the input signal of the circuit, and the second control signal is constituted by the output signal of the circuit. With regard to further details of the configuration of such an apparatus, the reader is referred to the aforesaid document, to whose contents reference is herewith expressly made.

The circuit according to the present invention can be implemented particularly well in programmable modules such as a field programmable gate array (FPGA).

FIG. 1 is a block diagram of a preferred exemplifying embodiment of a circuit according to the present invention, having a first delay unit 1 and a second delay unit 2. The input signal PULS_IN is inputted into first delay unit 1 and is delayed based on a first control value p. First delay unit 1 is embodied as a variable shift register whose effective length k can be influenced by the first control value p. What this means concretely is that the first control value p controls the depth of the shift register at which the delayed input signal is outputted. The input signal PULS_IN is a pulse train or logic signal that switches between a High level and a Low level, the granularity of the input signal PULS_IN being defined by a first clock signal CLK1. First delay unit 1 is therefore clock-timed by the first clock signal CLK1 and, at each rising edge of the first clock signal CLK1, shifts the input signal PULS_IN one location further within the shift register memory.

First delay unit 1 transfers the values $x_{t\_k-1}$ and $x_{t\_k}$ to second delay unit 2. These values are taken from the k-th and k−1-th location of the first shift register. The value $x_{t\_k-1}$ is thus generated by delaying the input signal PULS_IN by k−1 cycles of the first clock signal CLK1, and the value $x_{t\_k}$ is generated by delaying the input signal PULS_IN by k cycles of the first clock signal CLK1.

Figure 2:
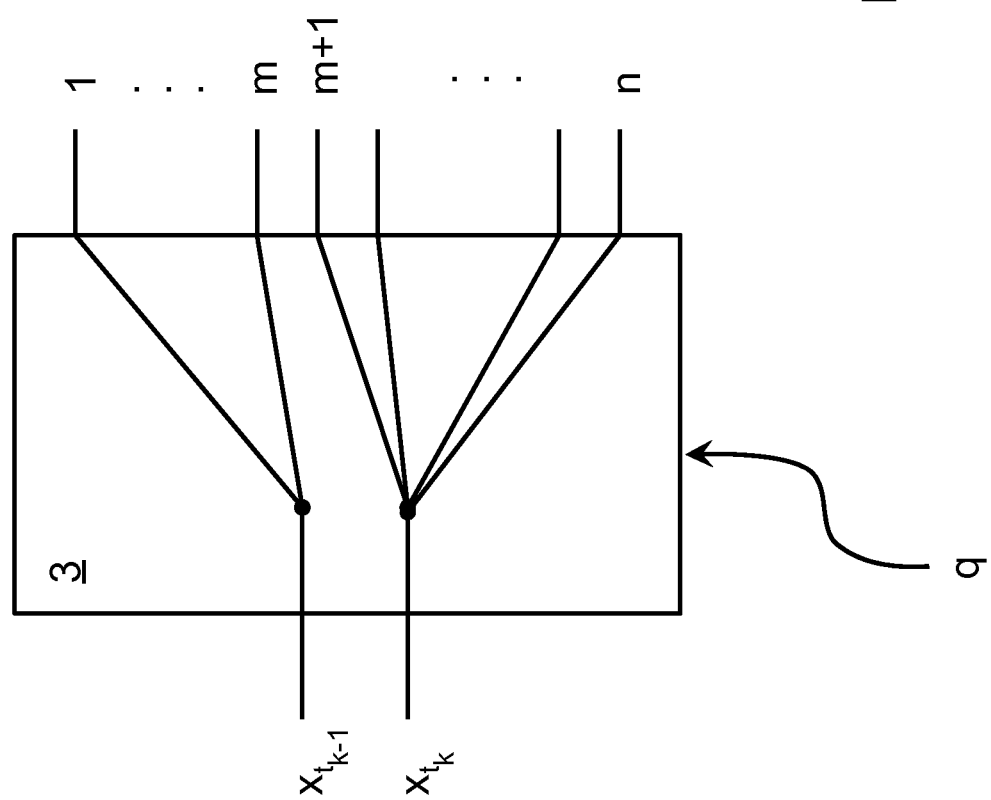

Within second delay unit 2, converter 3 receives the two values $x_{t\_k}$ and $x_{t\_k-1}$. The functional principle of converter 3 will be explained in more detail with reference to FIG. 2.

Converter 3 comprises a combinatorial logic unit that can be influenced by a second control value q. As a function of the second control value q, the value $x_{t\_k-1}$ is outputted at outputs 1 to m, and the value $x_{t\_k}$ is outputted at outputs m+1 to n. In a particularly simple embodiment, the second control value can have a width of n bits, and the value $x_{t\_k-1}$ is outputted at output i of the converter whenever a bit at location i of the second control value q is equal to a logical 0. Conversely, in the case of a logical 1 in the i-th bit of the second control value q, the value $x_{t\_k}$ is outputted at output i of the converter. Because the second control value q must in this fashion comprise quite a large number of bits, it is also conceivable for the second control value q to be constituted by a binary number that is converted by an optional decoder circuit (not depicted in FIG. 2) into correspondingly suitable logic values for the combinatorial logic unit.

The logic values present at outputs 1 to n of converter 3 are sent onto leads 1 to n that connect converter 3 to second shift register 4. The values $x_{t\_k-1}$ and $x_{t\_k}$ generated by converter 3 are thus respectively present at the n inputs of second shift register 4. Second shift register 4 comprises a trigger input and a clock input, the first clock signal CLK1 being present at the trigger input, and the second clock signal CLK2 being present at the clock input. The trigger input is used in such a way that at a rising edge of the applied clock signal, the logic values present at inputs 1 to n are conveyed into a shift register memory (not depicted) within second shift register 4. The values stored in the shift register memory are successively outputted by means of the clock signal present at the clock input. With each rising edge of the second clock signal CLK2, a switchover occurs from the presently addressed memory location of the shift register memory to the next memory location, so that little by little all the values stored in the shift register memory are outputted via the output of shift register 4. The output signal of the second shift register simultaneously constitutes the output signal of second delay unit 2, and thus the output signal PULS_OUT of the circuit as a whole.

The second clock signal CLK2 is generated in such a way that the frequency of the second clock signal CLK2 is an n-fold multiple of the first clock signal CLK1. Therefore:

$$f_{CLK1}:f_{CLK2}=1:n,$$

where $f_{CLK1}$ is the frequency of the first clock signal CLK1 and $f_{CLK2}$ is the frequency of the second clock signal CLK2, where the frequency $f_{CLK1}$, $f_{CLK2}$ is assumed to be the reciprocal of the respective period length $T_{CLK1}$, $T_{CLK2}$.

Figure 3:
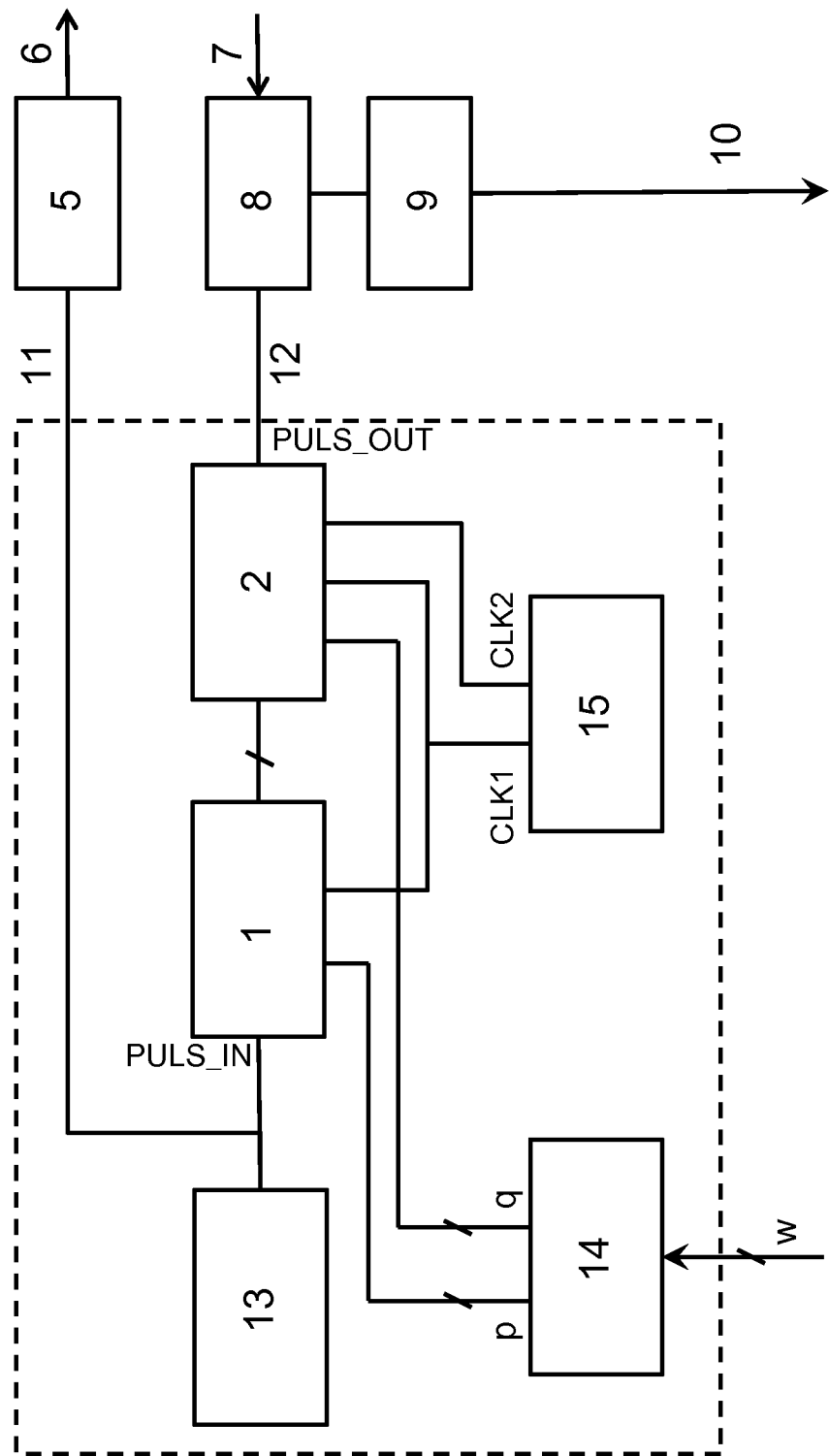
FIG. 3 is a block diagram of a microscope according to the present invention having a circuit according to the present invention.

FIG. 3 shows a microscope according to the present invention having a circuit according to the present invention. The circuit according to the present invention, including its essential wiring elements, is enclosed by a dashed line. In addition to the circuit, the microscope according to the present invention encompasses a laser light source 5 that generates an illuminating laser light beam 6 for illuminating a sample (not depicted). Illuminating laser beam 6 produces in the sample a detected light 7 that is created from illuminating laser beam 6, for example, as a result of fluorescence of the sample. Detected light 7 travels to a detection device 8 that generates a detector signal from the detected light. Detection device 8 is connected to a measurement system 9 that, from the detector signal, generates a measured signal 10 and outputs it.

The circuit, including the wiring elements, encompasses first and second delay units 1 and 2 in accordance with FIG. 1, a control unit 13, a delay calculation unit 14, and a clock generator 15. An input signal PULS_IN that is generated by control unit 13 is applied to the input of first delay unit 1.

Delay calculation unit 14 receives as an input value a total delay time w, from which delay calculation unit 14 calculates the first and the second control value p and q for the first and the second delay unit 1 and 2. For this purpose, delay calculation unit 14 "knows" the parameters of the circuit so that the control values p and q can be correctly calculated. Among the parameters are the width of the shift register memory of the first delay unit, the width n of second shift register 4, and the frequency of the first clock signal CLK1. The two control values p and q are transferred to the corresponding inputs of the first and second delay unit 1 and 2.

Clock generator 15 generates a first clock signal CLK1 and a second clock signal CLK2, the frequency of the second clock signal CLK2 being generated as an n-fold multiple of the first clock signal CLK1. The first clock signal CLK1 is transferred to the clock input of first delay unit 1 and to the trigger input of second delay unit 2. The second clock signal CLK2 is applied to the clock input of second delay unit 2.

Laser light source 5 is controlled with a first control signal 11, and detection device 8 is controlled with a second control signal 12. First control signal 11 is constituted by the pulse train that is generated by control unit 13 and is transferred as the input signal PULS_IN to first delay unit 1. The second control signal is generated by the circuit according to the present invention by delaying the first control signal 11, the delay being definable by the total delay time w that is entered into delay calculation unit 14.

To avoid repetition, reference is made to the general section of the description and to the attached claims with regard to further advantageous embodiments of the apparatus according to the present invention.

Lastly, be it noted explicitly that the exemplifying embodiment of the circuit according to the present invention and of the method according to the present invention described above serves merely for discussion of the teaching claimed, but does not limit it to the exemplifying embodiment.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B." Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise.

PARTS LIST

1 First delay unit
2 Second delay unit
3 Converter
4 Second shift register
5 Laser light source
6 Illuminating laser beam 7 Detected light
8 Detection device
9 Measurement system
10 Measured signal
11 First control signal
12 Second control signal
13 Control unit
14 Delay calculation unit
15 Clock generator
PULS_IN Input signal
PULS_OUT Output signal
k Effective length of first shift register
m Boundary between output of $x_{t\_k-1}$ and $x_{t\_k}$
n Width of second shift register
p First control value
q Second control value
w Total delay time

What is claimed is:

1. A circuit for controllably delaying an input signal, the circuit comprising:
a first delay unit and a second delay unit, the input signal being switched to the first delay unit which is configured to delay the input signal by k cycles of a first clock signal so as to generate a value $x_{t\_k}$, and transfer the input signal to the second delay unit,
wherein the second delay unit comprises a converter and a second shift register, the converter being connected to the second shift register by n leads,
wherein the value $x_{t\_k}$ and a value $x_{t\_k-1}$ are present at the converter, $x_{t\_k-1}$ being the input signal delayed by k−1 cycles of the first clock signal,
wherein the converter is configured such that the value $x_{t\_k-1}$ is present on leads 1 to m and the value $x_{t\_k}$ is present on leads m+1 to n, where 1≤m≤n−1, or such that the value $x_{t\_k-1}$ or $x_{t\_k}$ is present at all leads 1 to n, and
wherein the second shift register is configured to successively output values present on leads 1 to n as an output signal of the circuit.

2. The circuit according to claim 1, wherein the second shift register is timed using a second clock signal, the second clock signal being generated in such a way that $T_{CLK1}:T_{CLK2}=n:1$.

3. The circuit according to claim 1, wherein the first delay unit includes a first shift register whose effective length k is controllable by a first control value.

4. The circuit according to claim 3, wherein a second control value, by which m, and thus a boundary between the output of $x_{t\_k-1}$ and the output of $x_{t\_k}$, is defined and controlled, is present at an input of the converter.

5. The circuit according to claim 4, wherein the circuit includes a control device configured to generate and output the first control value and the second control value.

6. The circuit according to claim 1, wherein the converter includes a combinatorial logic unit.

7. The circuit according to claim 1, wherein the first delay unit is configured to transfer both $x_{t\_k}$ and $x_{t\_k-1}$ to the second delay unit.

8. The circuit according to claim 1, wherein the first clock signal is present at an input of the second shift register, the second shift register being configured in such a way that at each rising edge of the first clock signal, logic values present on leads 1 to n are conveyed into the second shift register.

9. A method for controllably delaying an input signal comprising:
delaying the input signal by k cycles of a first clock signal using a first delay unit in order to obtain a value $x_{t\_k}$;
transferring the value $x_{t\_k}$ to a converter;
transferring a value $x_{t\_k-1}$ to the converter, $x_{t\_k-1}$ being the input signal delayed by k−1 cycles of the first clock signal;
outputting of the value $x_{t\_k-1}$ on leads 1 to m and of the value $x_{t\_k}$ on leads m+1 to n by the converter, where 1≤m≤n−1, or outputting of the value $x_{t\_k-1}$ or of the value $x_{t\_k}$ on leads 1 to n by the converter;
outputting of the value $x_{t\_k}$ on leads m+1 to n by the converter;
transferring the values present on leads 1 to n to the second shift register; and
successively outputting the values present on leads 1 to n as an output signal using the second shift register.

10. A microscope for investigating a specimen, the microscope comprising:
a laser light source for illuminating the specimen, the laser light, source being configured to receive a first control signal operable to control an illuminating laser beam generated by the laser light source;
a detection device for detecting detected light proceeding from the specimen, the detection device being configured to receive a second control signal operable to control the detection device; and
a circuit, the first control signal being switched as an input signal to the circuit, and the second control signal being constituted by an output signal of the circuit, the circuit comprising:
a first delay unit and a second delay unit, the input signal being switched to the first delay unit which is configured to delay the input signal by k cycles of a first clock signal and so as to generate a value $x_{t\_k}$, and transfer the input signal to the second delay unit,
wherein the second delay unit comprises a converter and a second shift register, the converter being connected to the second shift register by n leads,
wherein the value $x_{t\_k}$ and a value $x_{t\_k-1}$ are present at the converter, $x_{t\_k}$ being the input signal delayed by k−1 cycles of the first clock signal,
wherein the converter is configured such that the value $x_{t\_k-1}$ present on leads 1 to m and the value $x_{t\_k}$ is present on leads m+1 to n, where 1≤m≤n−1, or such that the value $x_{t\_k-1}$ or $x_{t\_k}$ is present at all leads 1 to n, and
wherein, the second shift register is configured to successively output values present on leads 1 to n as an output signal of the circuit.

11. A method for controlling a microscope having a laser light source and a detection device, the laser light source being controlled by a first control signal, the detection device being controlled by a second control signal, the method comprising:
controllably delaying the first control signal so as to generate the second control signal, the first control signal being switched as an input signal to a first delay unit, the delaying of the first control signal including:
delaying the input signal by k cycles of a first clock using the first delay unit in order to obtain a value $x_{t\_k}$;
transferring the value $x_{t\_k}$ to a converter;
transferring a value $x_{t\_k-1}$ to the converter, $x_{t\_k-1}$ being the input signal delayed by k−1 cycles of the first clock signal;
outputting of the value $x_{t\_k-1}$ on leads 1 to m by the converter, where 1≤m≤n;
outputting of the value $x_{t\_k}$ on leads m+1 to n by the converter;
transferring the values present on leads 1 to n to a second shift register; and successively outputting the values present on leads 1 to n as an output signal using the second shift register, wherein the second control signal is constituted by the output signal of the second shift register.

* * * * *